United States Patent [19]

Pernici

[11] Patent Number: 5,541,555
[45] Date of Patent: Jul. 30, 1996

[54] HIGH PERFORMANCE TRANSCONDUCTANCE OPERATIONAL AMPLIFIER OF THE CMOS INTEGRATED TYPE

[75] Inventor: Sergio Pernici, Bergamo, Italy

[73] Assignee: SGS-Thomson Microelectronisc S.r.l., Milan, Italy

[21] Appl. No.: 347,574

[22] Filed: Nov. 30, 1994

[30] Foreign Application Priority Data

Nov. 30, 1993 [EP] European Pat. Off. ............... 93830479

[51] Int. Cl.⁶ ..................................................... H03F 3/45
[52] U.S. Cl. ........................................... 330/253; 330/292
[58] Field of Search ..................................... 330/252, 253, 330/260, 277, 292

[56] References Cited

U.S. PATENT DOCUMENTS

| 4,713,797 | 12/1987 | Morton et al. | 330/257 X |
| 5,079,514 | 1/1992 | Mijuskovic | 330/253 |
| 5,319,316 | 6/1994 | Fensch | 330/253 |
| 5,406,220 | 4/1995 | Jones et al. | 330/253 |

FOREIGN PATENT DOCUMENTS

| 57-060711 | 4/1982 | Japan | H03F 3/45 |
| 59-050556 | 3/1984 | Japan | H01L 27/08 |
| 61-100010 | 5/1986 | Japan | H03F 3/45 |

OTHER PUBLICATIONS

Senderowicz et al., "PCM Telephony: Reduced Architecture for a D/A Converter and Filter Combination," *IEEE Journal of Solid–State Circuits* 25(4):987–995, 1990.

*Primary Examiner*—Steven Mottola
*Attorney, Agent, or Firm*—David V. Carlson; Bryan A. Santarelli; Seed and Berry LLP

[57] ABSTRACT

High-performance operational transconductance amplifier monolithically integrable with CMOS technology comprising a differential input stage connected to a pair of cascode stages and a differential output stage. The output stage comprises two output transistors whose gate terminals are connected to nodes for connection of the input stage and the cascode stages. The output terminals of the amplifier are connected to intermediate nodes of the cascode stages through capacitors.

15 Claims, 2 Drawing Sheets

HIGH PERFORMANCE TRANSCONDUCTANCE OPERATIONAL AMPLIFIER OF THE CMOS INTEGRATED TYPE

TECHNICAL FIELD

The present invention relates to transconductance amplifiers and in particular a differential transconductance amplifier monolithically integrable with CMOS technology.

BACKGROUND OF THE INVENTION

By using CMOS processes at present it is possible to provided in a single integrated circuit complex systems comprising both analog and digital parts.

For the analog parts, provision of valid operational transconductance amplifiers (OTA) is essential.

Indeed, these amplifiers are the basis for the provision of many complex circuits such as filters or other circuits with switched, coding, decoding, etc., capacitors, i.e., condensers. These amplifiers fall in the broader class of operational amplifiers but are characterised by rather high output impedance even with closed loop. For this reason these amplifiers are particularly well suited in structures with feedback and capacitive load such as for example the above mentioned switched condenser circuits. But for resistive feedback, because of the high output impedance, even higher feedback resistors should be used and hence their use is not always possible.

There has been a considerable ongoing effort to improve the performance of these amplifiers. On one hand it is sought to improve their gain-band product, output dynamics, supply disturbance rejection noise and output piloting. On the other hand, it is sought to reduce the supply voltages to make them equivalent to those of digital circuits which, ever more often, operate typically at 3.3 V with minimum of even 2.7 V for battery supply.

The first solutions used by those skilled in the art were rather simple structures but did not offer high performance, especially in terms of stability.

A known OTA circuit topology represented in FIG. 1 ("Design techniques for cascode CMOS op amp with improved PSRR and common mode input range", Ribner—Copeland JSSC 12/84) includes a first cascoded stage and a second gain stage. A compensation capacitance, instead of being connected as in older solutions between the OTA output and the first stage output is connected to the source terminal of an M5 transistor with grounded gate terminal acting as the cascode. This simple variation considerably improved the circuit. In this manner, a zero to the right resulting from the frequency analysis is taken to a slightly higher frequency (as shown in the above mentioned article) and hence degradation of the phase margin introduced by it is less. There is also another zero to the left which further helps improve amplifier stability.

Compared with previous transconductance amplifiers, a predominant pole remains unchanged. However, instead of a second pole, there is a doublet of conjugate complex poles shifted to a slightly higher frequency. The shift factor is CC/C1 where CC is the compensation capacitance and C1 is the parasite capacitance at the first stage output.

SUMMARY OF THE INVENTION

The object of the invention is to obtain an operational transconductance amplifier (OTA) integrable with CMOS technology that can operate at low power supply voltages (at least down to |2.7 V|) with high output dynamics and high rejection of disturbances on the supply line, and that has, for a given capacitive load, better characteristics of stability and band-gain product than those achievable with existing OTAs.

The characteristics and advantages of an operational transconductance amplifier in accordance with the present invention are set forth in the description given below of an embodiment thereof given by way of nonlimiting example with reference to the annexed drawings.

DETAILED DESCRIPTION OF THE INVENTION

Figure 2:
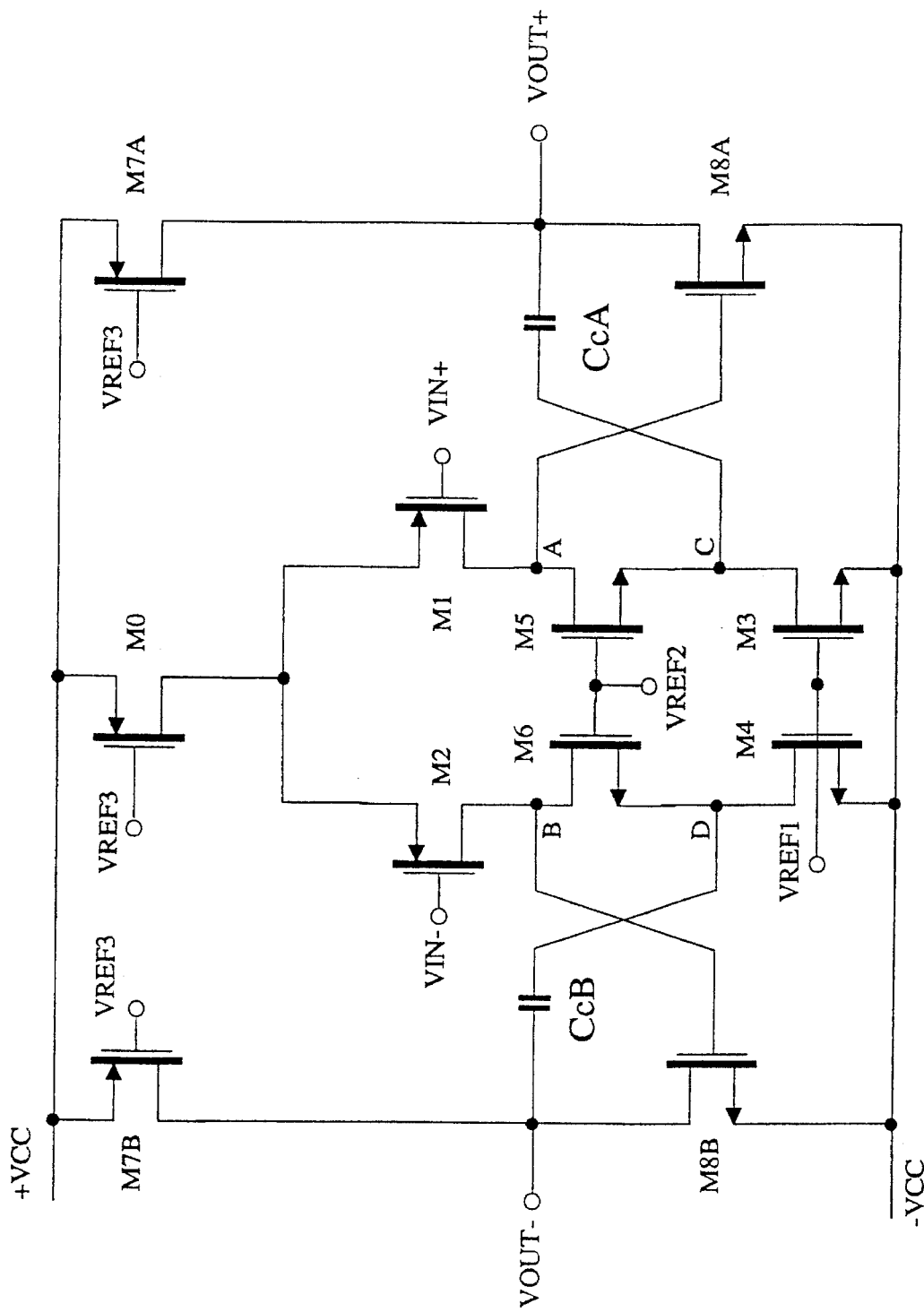
FIG. 2 shows a circuitry diagram of an operational transconductance amplifier in accordance with the present invention.

FIG. 2 shows an amplifier having a differential input circuit, a cascode circuit, an output circuit, and a capacitive feed back circuit. The input circuit has a pair of input terminals VIN− and VIN+ and a pair of input-circuit drive terminals that are respectively coupled to nodes A and B. The cascode circuit has a pair of cascode drive terminals that are respectively coupled to nodes C and D and a pair of cascode receive terminals that are respectively coupled to the input-circuit drive terminals at nodes A and B. The output circuit is coupled in parallel with the series combination of the input and cascode circuits, and has a pair of output receive terminals and a pair of output terminals VOUT− and VOUT+.

The input circuit includes first and second transistors M1 and M2, which each have a source, drain, and a gate. The sources are coupled to supply VCC+, the gates are each coupled to one of the input terminals, and the drains are each coupled to a corresponding one of the input-circuit drive terminals, which are coupled to nodes A and B.

The cascode circuit includes first and second stages. The first stage includes first transistor M5 and second transistor M3, and the second stage includes first transistor M6 and second transistor M4. The gates of the first transistors are coupled to reference voltage VREF2, and the gates of the second transistors are coupled to reference voltage VREF1. The sources of the second transistors are coupled to −VCC, and the drains of the second transistors are coupled to one of the cascode drive terminals, which are coupled to nodes C and D respectively. The remaining structure of the cascode circuit is discussed below.

The output circuit includes first and second stages. The first stage includes first and second transistors M7A and M8A, and the second stage includes first and second transistors M7B and M8B. The drains of M7A, and M8A are coupled to output terminal VOUT+ and the drains of M7B and M8B are coupled to output terminal VOUT−. The gates of second transistors M8A and M8B are coupled to a corresponding one of the output receive terminals, which, as described below, may be coupled to the cascode circuit at either node pair A and B or C and D.

The feedback circuit includes capacitor CcA, which has one terminal coupled to VOUT+ and another terminal coupled to either the cascode receive terminal at node A or the cascode drive terminal at node C, as discussed below. The feedback circuit also includes capacitor CcB, which has one terminal coupled to VOUT− and another terminal coupled to either the cascode receive terminal at node B or the cascode drive terminal at node D, as discussed below.

Figure 1:
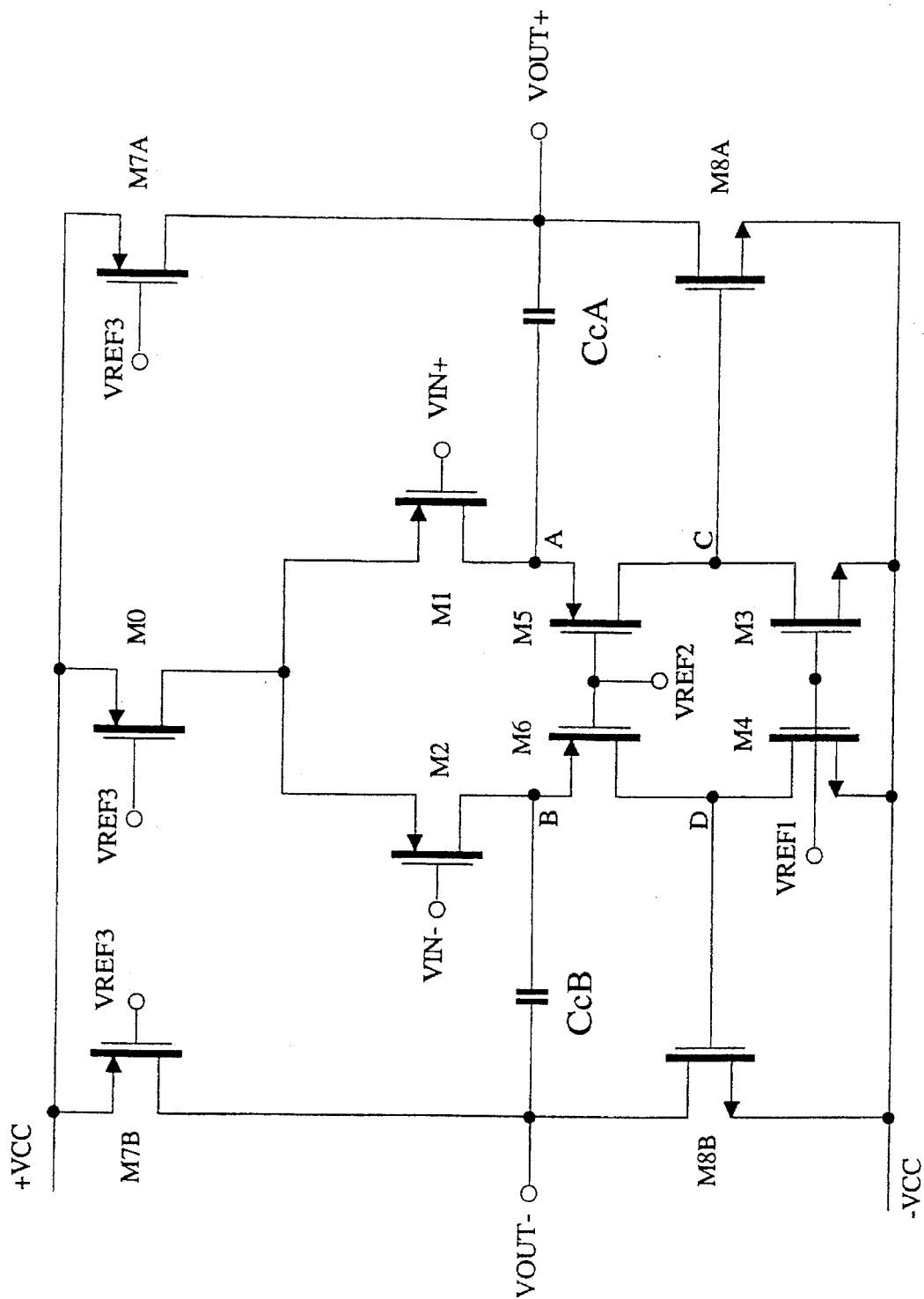
FIG. 1 shows the circuitry diagram of an existing circuit topology for an operational transconductance amplifier as mentioned above.

As discussed below, in one aspect of the invention, the cascode circuit is formed from low-threshold field effect transistors, the output circuit is formed from high-threshold field effect transistors, and the output receive terminals may be coupled to the cascode receive terminals at nodes A and B or the cascode drive terminals at nodes C and D. The latter configuration provides the same topology as shown in FIG. 1, with the novel requirement that the cascode circuit be formed from low-threshold field effect transistors, and the output circuit be formed from high-threshold field effect transistors. The feed back circuit is coupled between VOUT− and VOUT+ and the uncoupled cascode terminals.

In another aspect of the invention, the cascode and output circuits may be formed from other types of transistors. In this aspect, the output receive terminals are coupled to the cascode receive terminals at nodes A and B, and the feedback circuit is coupled between VOUT− and VOUT+ and the cascode drive terminals at nodes C and D. That is, with the inventive circuit having the topology shown in FIG. 2, the cascode circuit need not be formed from low-threshold field effect transistors, and the output circuit need not be formed from high-threshold field effect transistors to obtain advantages over the prior art.

Where the output receive terminals are coupled to the cascode drive terminals at nodes C and D, the drains of transistors M5 and M6 are coupled thereto and the sources of M5 and M6 as well as the corresponding terminals of capacitors CcA and CcB are coupled to the cascode receive terminals at nodes A and B. Where the output receive terminals are coupled to the cascode receive terminals at nodes A and B, the drains of transistors M5 and M6 are coupled thereto, and the sources of M5 and M6 as well as the corresponding terminals of capacitors CcA and CcB are coupled to the cascode drive terminals at nodes C and D. With either arrangement, the output receive terminals are coupled to the drains of transistors M5 and M6 and the feedback circuit is coupled to the sources of transistors M5 and M6 to give the transfer characteristics as discussed below.

In modern CMOS technologies for mixed analog-digital circuits there are almost always available MOS transistors with two different conduction thresholds, i.e., a higher one for digital circuits so that they do not dissipate power when not operating and the other lower to allow analog circuits to operate correctly even at low power supply voltages.

Between the higher and lower thresholds there is usually a difference of 300 mV to 350 mV. A typical process of this type can have for example a threshold of 750 mV for the high-threshold NMOS and a threshold of 400 mV for the low-threshold NMOS, and a threshold of 1.1 V for the high-threshold PMOS and 750 mV for the low-threshold PMOS. Typically the low-threshold NMOS is a natural transistor without channel implantation while in the other mentioned transistors, the threshold is controlled by implantation.

In accordance with the present invention, transistors with differentiated thresholds are used to solve some problems of the existing art. A circuit in accordance with the present invention can be provided with PMOS inputs as shown in FIG. 2 or in the dual configuration with NMOS inputs in a known manner.

The circuitry diagram shown in FIG. 2 is of a differential OTA. An undifferentiated, simplified structure would lack the advantages that are the purpose of the present invention.

The circuitry diagram of an operational transconductance amplifier in accordance with the present invention comprises a differential input stage having two transistors, M1 and M2, and a cascade stage having two branches, each branch having two transistors, M3 and M5 and M4 and M6, respectively, inserted in series with a current generator having a transistor M0 between two terminals +VCC and −VCC of a supply voltage generator.

Each branch of a differential output stage comprising two output transistors, M8A and M8B, is coupled in series with a corresponding one of the current generators that include two transistors, M7A and M7B, respectively.

The transistors M1, M2, M7A and M7B are PMOS and other transistors are NMOS.

As mentioned above, a circuit structure in accordance with the present invention may be the dual one of the structure shown in FIG. 2 (i.e., NMOS transistors shown in FIG. 2 become PMOS and PMOS transistors shown in FIG. 2 become NMOS). This dual circuit is also well suited to operating at low supply voltages thanks to the high output dynamics.

In accordance with the present invention in both types of structure the gate terminals of the output transistors M8A and M8B are connected to nodes A and B for connection between the input stage and the cascade stages.

The output terminals VOUT+ and VOUT− are connected to intermediate nodes C and D of the cascade stages through condensers CCA and CCB respectively.

To operate correctly for all the possible process variations, transistors M8A and M8B are high threshold while M3, M4, M5 and M6 are low threshold. The other transistors can be of either type. In this manner the input nodes A and B of the two cascade stages always have sufficient dynamics for the circuit to operate correctly.

A possible use of two-pole transistors cannot be excluded but with present technologies the advantages of the invention would probably be lost.

A transconductance amplifier in accordance with the present invention offers similar characteristics as the known topology of FIG. 1 in terms of output dynamics and rejection of disturbances on the supply but compared to it has a large advantage in terms of stability. Such an advantage can be understood by analyzing the position of the poles and zeroes of the transfer function between input and output. A circuit in accordance with the present invention has a predominant low-frequency pole and a pair of high-frequency, complex conjugate poles in a position similar to those of existing circuits.

The circuit of FIG. 2 also has a zero to the left, but it is at a lower frequency than that of existing circuits to help improve the phase margin.

It should however be noted that the zero to the right is at a much higher frequency than that of existing circuits and therefore the shift-down in the phase margin introduced thereby is almost negligible. The result is a stability for equal load and dimensions of the transistors much better than that of existing circuits and the improvement in terms of phase margin can be on the order of 30 degrees or more.

As an alternative embodiment that keeps the same stability as the OTA of FIG. 2, the amplifier frequency band can be broadened to obtain a circuit much faster than existing circuits such as that of FIG. 1 without increasing the integration area and operating current.

In the existing circuit of FIG. 1, the zero to the right is determined by the capacitance CC which constitutes a path parallel to that of the signal and at the frequency of the zero takes from the output node the same current injected from the signal path and canceling de facto the output signal. In a circuit in accordance with the present invention said parallel path is given by the Cgd of the transistor M8 which, being much smaller than CC, gives a zero to the right with much higher frequency.

The reason the zero to the left is at lower frequency is that in determining this zero, CC (CCA for M8A and CCB for M8B) is involved in the calculation while for the FIG. 1 circuit, the Cgd of the transistor M8 is so involved. The capacitance CC has a higher value and lowers the frequency of the zero to the left, further improving the phase margin.

The only capacitance on which depends the zero to the right is Cgd8, which is a small parasite capacitance. This zero therein has very high frequency. In the FIG. 1 circuit, it also depended on the compensation capacitance CC, which had a higher a value. Therefore, the right-hand zero in the FIG. 1 circuit occurs at a lower frequency and considerably worsens amplifier stability.

A differential transconductance amplifier in accordance with the present invention can also operate at low supply voltages with high rejection of disturbances on the supply lines. This circuit can be provided in a CMOS process in which the n-channel or p-channel transistors or both have two types of threshold, i.e., one high and one low. An advantage of the present invention is an intrinsically greater stability thanks to the zero-pole position of the transfer function compared to existing circuits. Alternatively, the present invention may provide a greater gain-band product for given phase margin and load values and for comparable transistor sizes.

It will be appreciated that, although various embodiments of the invention have been described herein for purposes of illustration, modifications may be made without departing from the spirit and scope of the invention. Accordingly, the invention is not limited except as by the appended claims.

I claim:

1. Operational transconductance amplifier comprising a differential input stage inserted between two terminals of a supply voltage generator in series with a first and a second cascode stage connected thereto in parallel with each other and a differential output stage in which a first transistor and a second transistor are inserted with a first and a second terminal respectively each in series with a first and a second current generator respectively between the two supply voltage generator terminals and characterised in that the first terminal of the first transistor and the first terminal of the second transistor, which are output terminals of the amplifier are coupled with an intermediate node of the first cascode stage and an intermediate node of the second cascode stage respectively through a first and a second condenser and in that a connection node between the input stage and the first cascode stage and a connection node between the input stage and the second cascode stage are connected to a command terminal of the first transistor and a command terminal of the second transistor respectively.

2. Operational amplifier in accordance with claim 1 characterised in that the differential input stage comprises a pair of transistors having first terminals connected to the first and second cascode stages respectively, second terminals connected to a first terminal of the supply voltage generator through a current generator and command terminals which are input terminals of the amplifier.

3. Operational amplifier in accordance with claim 2 characterised in that each cascode stage comprises a pair of transistors and inserted in series between them with first and second terminals between the differential input stage and a second terminal of the supply voltage generator and having command terminals connected to polarisation circuitry means and the connection nodes between the transistors of each pair being said intermediate nodes of the first and second cascode stage.

4. Operational amplifier in accordance with claim 2 characterised in that the current generators are transistors.

5. Operational amplifier in accordance with claim 4 characterised in that the transistors of the differential input stage and of the current generators have a first type of conductivity and the transistors of the cascode stages and said first and second transistors have a second type of conductivity opposite that of the first.

6. Operational amplifier in accordance with claim 5 characterised in that it is integrated with CMOS technology.

7. Operational amplifier in accordance with claim 6 characterised in that the transistors of the cascode stages are low-threshold MOS transistors and said first and second transistors are high-threshold MOS transistors.

8. An amplifier comprising:

a differential input circuit having a pair of input terminals and a pair of input-circuit drive terminals;

a cascode circuit having a pair of cascode drive terminals and a pair of cascode receive terminals each coupled to one of said input-circuit drive terminals;

an output circuit coupled in parallel to the series combination of said input circuit and said cascode circuit, said output circuit having a pair of output terminals and having a pair of output receive terminals coupled to said cascode receive terminals; and a feedback circuit coupled between said output terminals and said cascode drive terminals.

9. The amplifier of claim 8 wherein said cascode circuit comprises low-threshold field effect transistors and wherein said output circuit comprises high-threshold field effect transistors.

10. The amplifier of claim 9 wherein said cascode circuit comprises:

first and second stages each including first and second transistors, each transistor having a source, drain, and gate;

wherein each of said drains of said first transistors is coupled to a corresponding one of said cascode receive terminals;

wherein each of said sources of said first transistors is coupled to a corresponding one of said cascode drive terminals; and wherein each of said drains of said second transistors is coupled to a corresponding one of said cascode drive terminals.

11. The amplifier of claim 8 wherein said output circuit comprises:

first and second stages each including first and second transistors having a source, drain and gate;

wherein said drains of said first and second transistors in each state are coupled to a corresponding one of said output terminals; and wherein said gates of said second transistors are coupled to a corresponding one of said output receive terminals.

12. An amplifier comprising:

a differential input circuit having a pair of input terminals and a pair of input-circuit drive terminals;

a cascode circuit formed from low-threshold field effect transistors and having a pair of cascode drive terminals and having a pair of cascode receive terminals coupled to said input-circuit drive terminals;

a differential output circuit coupled in parallel with the series combination of said input and cascode circuits, said output circuit formed from high-threshold field effect transistors and having a pair of output receive terminals and a pair of output terminals;

a capacitive feedback circuit coupled between said output terminals and said cascode circuit; and wherein said cascode circuit includes,
  first and second stages each including first and second low-threshold field effect transistors, each transistor having a source, drain, and gate,
  wherein each of said drains of said first transistors is coupled to a corresponding one of said output receive terminals and to a corresponding one of said cascode receive terminals, and
  wherein each of said sources of said first transistors are coupled to said feedback circuit and to a corresponding one of said cascode drive terminals.

13. An amplifier comprising:

a differential input circuit having a pair of input terminals and a pair of input-circuit drive terminals;

a cascode circuit formed from low-threshold field effect transistors and having a pair of cascode drive terminals and having a pair of cascode receive terminals coupled to said input-circuit drive terminals;

a differential output circuit coupled in parallel with the series combination of said input and cascode circuits, said output circuit formed from high-threshold field effect transistors and having a pair of output receive terminals and a pair of output terminals;

a capacitive feedback circuit coupled between said output terminals and said cascode circuit;

wherein each of said output receive terminals is coupled to a corresponding one of said cascode receive terminals; and wherein said output circuit includes,
  first and second branches each including first and second high-threshold field effect transistors, each transistor having a source, drain and gate,
  wherein each of said drains of said first and second transistors is coupled to a corresponding one of said output terminals, and
  wherein each of said gates of said first and second transistors is coupled to a corresponding one of said output receive terminals.

14. An amplifier comprising:

a differential input circuit having a pair of input terminals and a pair of input-circuit drive terminals;

a cascode circuit formed from low-threshold field effect transistors and having a pair of cascode drive terminals and having a pair of cascode receive terminals coupled to said input-circuit drive terminals;

a differential output circuit coupled in parallel with the series combination of said input and cascode circuits, said output circuit formed from high-threshold field effect transistors and having a pair of output receive terminals and a pair of output terminals, each of said output receive terminals coupled to a corresponding one of said cascode receive terminals; and a capacitive feedback circuit coupled between said output terminals and said cascode drive terminals.

15. The amplifier of claim 14 wherein said cascode circuit comprises:

first and second stages each including first and second transistors, each transistor having a source, drain, and gate;

wherein each of said drains of said first transistors is coupled to a corresponding one of said cascode receive terminals;

wherein each of said sources of said first transistors is coupled to a corresponding one of said cascode drive terminals; and wherein each of said drains of said second transistors is coupled to a corresponding one of said cascode drive terminals.

* * * * *

UNITED STATES PATENT AND TRADEMARK OFFICE
CERTIFICATE OF CORRECTION

PATENT NO. : 5,541,555
DATED : July 30, 1996
INVENTOR(S) : Sergio Pernici

It is certified that error appears in the above-indentified patent and that said Letters Patent is hereby corrected as shown below:

In column 6, claim 10, line 40, please delete "9" and insert therefor --8--.

Signed and Sealed this

Seventh Day of January, 1997

Attest:

BRUCE LEHMAN

*Attesting Officer*    *Commissioner of Patents and Trademarks*